(12) United States Patent
Liu

(10) Patent No.: US 10,049,970 B2
(45) Date of Patent: Aug. 14, 2018

(54) METHODS OF MANUFACTURING PRINTED CIRCUIT BOARD AND SEMICONDUCTOR PACKAGE

(71) Applicant: Samsung Electronics Co., Ltd., Suwon-si, Gyeonggi-do (KR)

(72) Inventor: Hai Liu, Suzhou (CN)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/183,868

(22) Filed: Jun. 16, 2016

(65) Prior Publication Data

US 2016/0372408 A1    Dec. 22, 2016

(30) Foreign Application Priority Data

Jun. 17, 2015  (CN) .......................... 2015 1 0337419
Nov. 17, 2015  (KR) ........................ 10-2015-0161042

(51) Int. Cl.
*H01L 23/498*    (2006.01)
*H01L 21/48*    (2006.01)
(Continued)

(52) U.S. Cl.
CPC .... *H01L 23/49816* (2013.01); *H01L 21/4853* (2013.01); *H01L 23/49866* (2013.01);
(Continued)

(58) Field of Classification Search
CPC ... H01L 23/49816; H01L 24/11; H01L 24/13; H01L 23/49866; H01L 21/4853; H01L 2224/11849; H01L 24/16; H01L 2224/11334; H01L 24/32; H01L 2224/131; H01L 2224/13111; H01L 2224/81447; H05K 1/00
See application file for complete search history.

(56) References Cited

U.S. PATENT DOCUMENTS 7,576,438 B2    8/2009  Jung et al.
7,888,259 B2    2/2011  Zbrzezny et al.
(Continued)

FOREIGN PATENT DOCUMENTS

CN    101409273 A    4/2009
CN    201878421 U    6/2011
(Continued)

OTHER PUBLICATIONS

Jeon et al., "Thin Electroless Cu/OSP on Electroless Ni as a Novel Surface Finish for Flip Chip Solder Joints." *Electronics Components and Technology Conference*, 2006.

*Primary Examiner* — Selim Ahmed
(74) *Attorney, Agent, or Firm* — Harness, Dickey & Pierce, P.L.C.

(57) ABSTRACT

A method of manufacturing a semiconductor package according to the present inventive concepts comprises preparing a printed circuit board (PCB) including a protected layer, exposing a portion of the protected layer from the insulating layer, forming a solder ball land by processing the exposed surface of the protected layer, forming a solder ball on the solder ball land, and mounting a semiconductor chip on the solder ball formed on the PCB. The solder balls include copper of about 0.01 wt % to about 0.5 wt %.

18 Claims, 13 Drawing Sheets

(51) Int. Cl.
  *H01L 23/00*   (2006.01)
  *H05K 1/00*   (2006.01)
  *H01L 25/065*   (2006.01)
  *H01L 23/31*   (2006.01)
  *H01L 25/10*   (2006.01)

(52) U.S. Cl.
  CPC .............. *H01L 24/11* (2013.01); *H01L 24/13* (2013.01); *H05K 1/00* (2013.01); *H01L 23/3128* (2013.01); *H01L 24/16* (2013.01); *H01L 24/32* (2013.01); *H01L 24/50* (2013.01); *H01L 25/0657* (2013.01); *H01L 25/105* (2013.01); *H01L 2224/03828* (2013.01); *H01L 2224/11334* (2013.01); *H01L 2224/11849* (2013.01); *H01L 2224/131* (2013.01); *H01L 2224/13111* (2013.01); *H01L 2224/16145* (2013.01); *H01L 2224/16227* (2013.01); *H01L 2224/32225* (2013.01); *H01L 2224/73204* (2013.01); *H01L 2224/81192* (2013.01); *H01L 2224/81447* (2013.01); *H01L 2224/92125* (2013.01); *H01L 2225/06513* (2013.01); *H01L 2225/06517* (2013.01); *H01L 2225/06541* (2013.01); *H01L 2225/06565* (2013.01); *H01L 2225/1023* (2013.01); *H01L 2225/1058* (2013.01); *H01L 2924/014* (2013.01); *H01L 2924/0105* (2013.01); *H01L 2924/01028* (2013.01); *H01L 2924/01029* (2013.01); *H01L 2924/15311* (2013.01); *H01L 2924/15331* (2013.01)

(56) References Cited

U.S. PATENT DOCUMENTS

| | | | |
|---|---|---|---|
| 8,039,972 B2 | 10/2011 | Jung et al. | |
| 8,143,722 B2 | 3/2012 | Curtis et al. | |
| 8,562,906 B2 | 10/2013 | Tanaka et al. | |
| 8,981,559 B2 | 3/2015 | Hsu et al. | |
| 9,219,030 B2 | 12/2015 | Yu et al. | |
| 2006/0166402 A1* | 7/2006 | Lim | H01L 21/76834 438/108 |
| 2006/0252248 A1* | 11/2006 | Hu | H05K 3/243 438/613 |
| 2007/0069347 A1* | 3/2007 | Lin | H01L 23/3192 257/673 |
| 2007/0218676 A1 | 9/2007 | Wang et al. | |
| 2008/0151519 A1* | 6/2008 | Sakamoto | H01L 21/4846 361/764 |
| 2008/0151522 A1* | 6/2008 | Sakamoto | H01L 21/568 361/783 |
| 2009/0200362 A1* | 8/2009 | Jung | B23K 1/0016 228/179.1 |
| 2009/0233436 A1* | 9/2009 | Kim | H01L 24/11 438/614 |
| 2010/0240174 A1 | 9/2010 | Yu et al. | |
| 2012/0098120 A1 | 4/2012 | Yu et al. | |
| 2012/0325671 A2 | 12/2012 | Keigler et al. | |
| 2014/0061287 A1 | 3/2014 | Ohnishi et al. | |
| 2014/0069694 A1 | 3/2014 | Cho et al. | |

FOREIGN PATENT DOCUMENTS

| | | |
|---|---|---|
| CN | 103377955 A | 10/2013 |
| CN | 103515362 A | 1/2014 |
| EP | 1087648 A2 | 9/2000 |
| KR | 10-0723497 B1 | 6/2007 |
| KR | 10-0865780 B1 | 10/2008 |
| KR | 2010-0078957 A | 7/2010 |
| KR | 2013-0073995 A | 7/2013 |
| KR | 2014-0025406 A | 3/2014 |

\* cited by examiner

METHODS OF MANUFACTURING PRINTED CIRCUIT BOARD AND SEMICONDUCTOR PACKAGE

CROSS-REFERENCE TO RELATED APPLICATIONS

This application claims priority under 35 U.S.C. § 119 to Chinese Patent Application No. 201510337419.0, filed on Jun. 17, 2015, in the State Intellectual Property Office of the and Korean Patent Application No, 10-2015-0161042, filed on Nov. 17, 2015, in the Korean Intellectual Property Office, the disclosures of each of which are incorporated herein in their entirety by reference.

BACKGROUND

The inventive concepts relate to methods of manufacturing a printed circuit board (PCB) and/or a semiconductor package, and more particularly, to PCB manufacturing methods with improved thermal cycling reliability and for economically performing surface processing of a conductive pattern, and/or methods of manufacturing a semiconductor package including the PCB.

In the current electronic product market, demands for mobile devices are rapidly increasing. Accordingly, demands for small and light-weight electronic components for such mobile devices are also continuously increasing. Overall thicknesses of semiconductor packages tend to decrease and memory capacities tend to increase so as to reduce sizes and weights of the electronic components. In order to provide a large capacity memory in a limited structure of a semiconductor package, instead of connecting a semiconductor chip and a PCB to each other via wire bonding, the semiconductor chip and the PCB are connected to each other via flip chip bonding.

SUMMARY

The inventive concepts provide printed circuit board (PCB) manufacturing methods that may economically improve thermal cycling reliability, and methods of manufacturing a semiconductor package including the PCB.

Additional aspects will be set forth in part in the description which follows and, in part, will be apparent from the description, or may be learned by practice of the presented example embodiments.

According to an example embodiment of the inventive concepts, a method of manufacturing a PCB includes preparing a substrate including an insulating layer and a protected layer, exposing the protected layer through the insulating layer, forming a first metal layer on the protected layer, forming a second metal layer on the first metal layer, the second metal layer, including copper, and forming an organic solderability preservative (OSP) film on the second metal layer.

The protected layer may be a conductive pattern including copper.

The first metal layer may include nickel.

A height of the first metal layer may range from about 1 µm to about 20 µm.

A height of the second metal layer may range from about 0.05 µm to about 2 µm.

The height of the second metal layer may range from about 0.15 µm to about 0.95 µm.

A height of the OSP film may range from about 0.05 µm to about 2 µm.

According to an example embodiment of the inventive concepts, a method of manufacturing a semiconductor package includes preparing a PCB including a protected layer, exposing a portion of the protected layer, forming a solder ball land by processing the exposed surface of the protected layer, forming a solder ball on the solder ball land, and mounting a semiconductor chip on the solder ball formed on the PCB. The solder ball may include copper of about 0.01 wt % to about 0.5 wt %.

The forming a solder ball land may include forming a nickel layer on the protected layer, forming a copper layer on the nickel layer, and forming an OSP film on the copper layer.

The forming a solder balls may include removing the OSP, providing the solder ball on the solder ball land, dissolving the copper layer into the solder ball such that the solder ball and the nickel layer are bonded to each other.

After the dissolving the copper layer into the solder ball, an intermetallic compound including an alloy of nickel, copper, and tin may be formed between the nickel layer and each of the solder ball.

The removing the OSP may include removing the OSP film by coating the OSP film with flux, the flux including an alcoholic component and an acidic component.

A height of the copper layer before the dissolving may range from about 0.15 µm to about 0.95 µm, and after completing the dissolving, the solder ball may include copper of about 0.01 wt % to about 0.5 wt %.

The solder ball may be an unleaded solder ball including tin.

A height of the nickel layer may range from about 1 µm to about 20 µm, and a height of the OSP film may range from about 0.05 µm to about 2 µm.

According to an example embodiment of the inventive concepts, a method of manufacturing a printed circuit board (PCB) includes forming a stack of a first metal layer, a second metal layer, and a oxidation prevention layer on a solder ball land in the PCB.

The first metal layer may include a first material that at least inhibits a second material in the second metal layer from dissolving into the solder ball land.

The first material may be nickel.

The method may further include removing the oxidation prevention layer using a flux, placing, after the removing, a solder ball on the second metal layer, and performing soldering on the resultant structure such that the second metal layer is substantially entirely dissolved into the solder ball.

The method may further includes removing the oxidation prevention layer using a flux, placing, after the removing, a unleaded solder ball on the second metal layer, and performing soldering on the resultant structure such that the second metal layer is dissolved into the solder balls, while leaving an intermetallic compound on the first metal layer.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
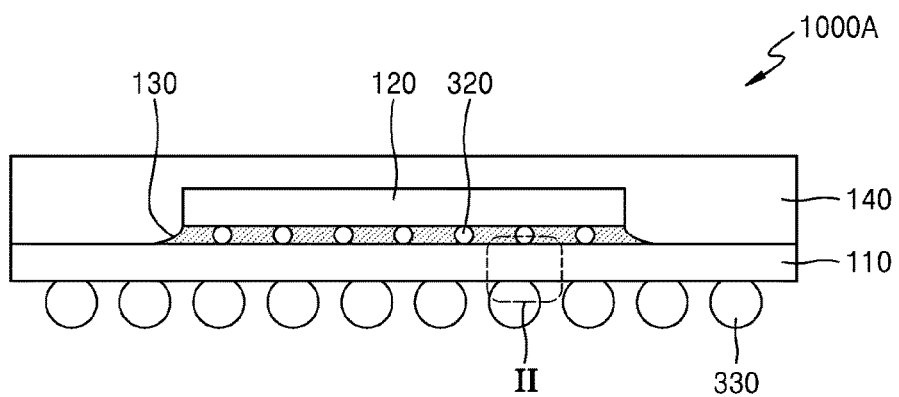
FIG. 1 is a cross-sectional view of a semiconductor package that is manufactured by a method of manufacturing the semiconductor package according to an example embodiment of the inventive concepts.

In order to provide sufficient understanding of features and effects of the inventive concepts, example embodiments of the inventive concepts are described with reference to the accompanying drawings. However, the present inventive concepts is not limited to the example embodiments described below, and various substitutions; amendments, or modifications may be made to the example embodiments. The example embodiments of the present inventive concepts are provided to describe the present inventive concepts to one of ordinary skill in the art to which the present inventive concepts pertains. Sizes of components in the drawings may be exaggerated for convenience of explanation. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "formed on" or "contacts" another element, the element may be directly touching or connected to the other element, or intervening elements may be present. However, when an element is referred to as being "directly formed on" or "directly contacts" another element, intervening elements may not be present. Other expressions that describe relationships between elements, such as "between" and "directly between," may also be understood similarly to the above description.

It will be understood that although the terms "first," "second," etc. may be used herein to describe various components. However, these components should not be limited by these terms. These terms do not indicate a specific order or superiority, but are only used to distinguish one component from another. Therefore, a first component may indicate a second component without departing from teachings of the present inventive concepts. For example, within the scope of the present inventive concepts, a first component may be referred to as a second component, and vice versa.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The terms used in the present specification are merely used to describe example embodiments, and are not intended to limit embodiments. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless defined otherwise, all terms used in the description including technical or scientific terms have the same meaning as commonly understood by one of ordinary skill in the art to which the present inventive concepts pertains.

Unless specifically indicated in the example embodiments, a vertical direction and a horizontal direction respectively refer to directions vertical and horizontal to a main surface of a printed circuit board (PCB) of a semiconductor package. Also, unless specifically indicated in the example embodiments, a lower surface of an element stacked on the package substrate refers to a surface facing the PCB, and an upper surface of the element refers to a surface opposite to the surface of the element facing the PCB.

Hereinafter, the example embodiments of the present inventive concepts will be described with reference to the accompanying drawings.

FIG. 1 is a cross-sectional view of a semiconductor package 1000A that is manufactured by a method of manufacturing the semiconductor package according to an example embodiment of the inventive concepts.

Referring to FIG. 1, in the semiconductor package 1000A, a semiconductor chip 120 is mounted on a PCB 110 via internal connecting terminals 320.

First, the PCB 110 is a supporting substrate and may include a body layer (not shown), a lower protection layer (not shown), and an upper protection layer (not shown). The PCB 110 includes wires (not shown), and the wires may electrically connect the PCB 110 to the semiconductor chip 120 via the internal connecting terminals 320. Also, the PCB 110 may include external connecting terminals 330. The PCB 110 maybe electrically connected to and mounted on a module substrate (not shown) or a system board (not via the external connecting terminals 330.

The body layer may include one or a plurality of wire pattern layers. The external connecting terminals 330 may be electrically connected to the semiconductor chip 120 via the wire patterns. The lower and upper protection layers may protect the body layer. For example, the lower and upper protection layers may be provided as solder resist.

In general, the body layer may be formed by compressing polymer materials, for example, thermosetting resin, epoxy-based resins (e.g., flame retardant 4 (FR-4), bismaleimide triazine (BT), and Ajinomoto Build-up Film (ABF)), or phenol resins to a certain thickness into a thin film, covering both surfaces with copper foils, and patterning a conductive pattern that is a transmission path of electric signals. Also, conductive patterns on upper and lower surfaces of the body layer may be electrically connected to each other through a via (or vias) that penetrates the body layer. Solder resist (118 of FIG. 2) may be coated on the upper and lower surfaces of the body layer except for terminal connecting areas at which an upper conductive pad (210 of FIG. 2) and a lower conductive pad (108 of FIG. 2) are exposed. Thus, the resultant solder resist pattern may form the lower and upper protection layers.

The, PCB may be a single layer PCB, which has wires formed on only one surface, or a double layer PCB, which has wires formed on both surfaces. Also, three or more copper foil layers may be formed by using an insulating material such as prepreg. By forming three or more wiring layers according to the number of the copper foil layers, a multiple layer PCB may be provided. However, the example embodiments are not limited to the above-described structure or materials of the PCB.

The semiconductor package 1000A may further include an underfill 130 that fills a space between the semiconductor chip 120 and the PCB 110. Also, the semiconductor package 1000A may further include a molding material 140 on the PCB 110 that seals the semiconductor chip 120, and the external connecting terminals 330 under the PCB 110 that may extend the function of the semiconductor chip 120 to an external device.

The internal connecting terminals 320 include a conductive material and is used to bond the semiconductor chip 120 to the PCB 110 via, for example, tape-automated bonding (TAB) or flip chip bonding. The internal connecting terminals 320 may directly connect, for example, a ball grid array (BGA), a chip scale package (CSP), etc. to the PCB 110. The internal connecting terminals 320 may include, for example, solder balls or solder bumps.

When the internal connecting terminals 320 and the external connecting terminals 330 include solder halls, the internal connecting terminals 320 and the external connecting terminals 330 may be ball-shaped due to the surface tension effect after a reflow process. According to an example embodiment, the internal connecting terminals 320 and the external connecting terminals 330 may be formed as lead free solder balls that include tin (Sn). As shown in FIG. 1, the internal connecting terminals 320 may be smaller than the external connecting terminals 330.

For convenience of description, an example in which the internal connecting terminals 320 and the external connecting terminals 330 are solder balls will be described below.

Figure 2:
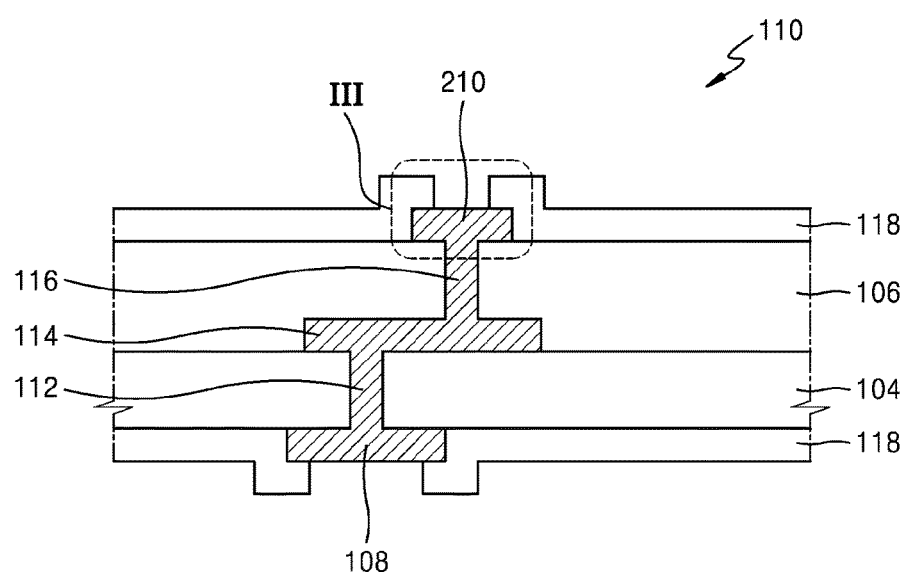
FIG. 2 is an enlarged cross-sectional view of an inner vertical structure of a printed circuit board (PCB) of FIG. 1.

FIG. 2 is an enlarged cross-sectional view of an inner vertical structure of a PCB of FIG. 1.

FIG. 2 shows a cross-sectional view of the PCB 110, in which an upper conductive pad 210 overlaps an upper via 116, and a lower conductive pad 108 overlaps a lower via 112. The internal connecting terminals 320 of FIG. 1 may be provided on the upper conductive pad 210, and the external connecting terminals 330 of FIG. 1 may be provided on the lower conductive pad 108. For example, the upper conductive pad 210, an intermediate metal layer 114, and the lower conductive pad 108 are sequentially stacked on a first insulating layer 104 and a second insulating layer 106. The upper conductive pad 210, the intermediate metal layer 114, and the lower conductive pad 108 are electrically connected to each other via the upper via 116 and the lower via 112. Connecting areas of the upper conductive pad 210 and the lower conductive pad 108 are exposed, while other areas of the upper conductive pad 210 and the lower conductive pad 108 are covered by solder resist 118. An exposed area (e.g., connecting area) of the lower conductive pad 108 may be a surface processed area to which the external connecting terminals 330 of FIG. 1 (e.g., solder balls) are bonded. An exposed area (e.g., connecting area) of the upper conductive pad 210 may be a surface processed solder ball land to which the internal connecting terminals 320 of FIG. 1 are bonded.

As described above, the internal connecting terminals 320 of FIG. 1 may be smaller than the external connecting terminals 330 of FIG. 1. Therefore, the exposed area (e.g., connecting area) of the upper conductive pad 210 may be smaller than the exposed area (e.g., connecting area) of the lower conductive pad 108. Although the exposed areas have different sizes, the upper conductive pad 210 and the lower conductive pad 108 may have identical functions.

Although the drawings illustrate an example of the PCB 110 including three metal layers, the number of metal layers may be, for example, two, four, or more.

Figure 3:
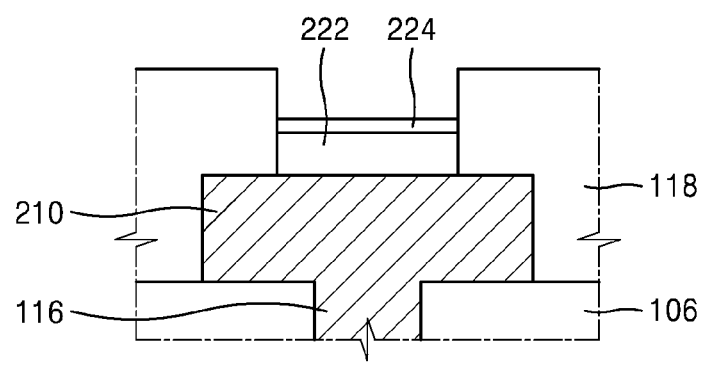
FIGS. 3 and 4 are enlarged cross-sectional views of a solder ball land of a PCB that is surface processed, according to some comparative examples.
Figure 4:
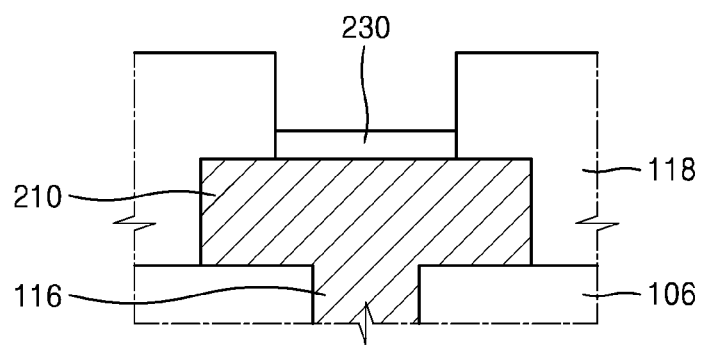

FIGS. 3 and 4 are enlarged cross-sectional views of a solder ball land (III of FIG. 2 of a PCB, a surface of which is processed), according to some comparative examples.

FIGS. 3 and 4 show comparative examples of solder ball lands that are surface processed to mitigate or prevent oxidization of the upper conductive pad 210. The upper conductive pad 210 may be referred to as a 'protected layer' because the upper conductive pad 210 is protected by processing its surface to form a nickel layer and a gold layer. The lower conductive pad 108 of FIG. 2 may also be surface processed as the upper conductive pad 210. For convenience of description, although the upper conductive pad 210 is described as an example, the description may also be applied to the lower conductive pad 108 of FIG. 2.

A circuit in a PCB may be generally formed by using a copper foil including copper (Cu). Alternatively, the circuit may be formed by using silver (Ag), aluminum (Al), tin (Sn), and the like. The upper conductive pad 210 may be a conductive material including Cu.

In this case, Cu in the upper conductive pad 210 may be oxidized when exposed to air. Oxidization may hinder soldering, and thus, solder balls may not be appropriately mounted on the upper conductive pad 210 of the PCB. Therefore, in order to appropriately mount solder balls on the upper conductive pad 210 without defects, treating the surface of the upper conductive pad 210 may be desired to mitigate or prevent unwanted oxidization.

FIG. 3 shows a cross-section of the solder ball land, which refers to the connecting area of the upper conductive pad 210 exposed by the solder resist 118. The surface of the solder ball land is processed using electroless plating. Electroless plating is applicable to PCBs that require highly dense micro circuits, such as mobile phones. Compared to other surface processing techniques, electroless plating is a desirable technique in terms of thermal cycling reliability, operation convenience and solderability.

First, by using the electroless plating technique, the nickel layer 222 may be formed on the upper conductive pad 210 to about 3 μm to about 5 μm, and the gold layer 224 is formed on the nickel layer 222 to about 0.03 μm to about 0.07 μm. The electroless plating may be a desirable technique for highly dense micro circuits because the nickel layer 222 and the gold layer 224 may be selectively plated on the upper conductive pad 210. However, manufacturing cost of this technique is relatively expensive due to the usage of gold (Au). Further, managing phosphate (P) concentration in a plating bath for forming the nickel layer 222 may be difficult. Thus, oxidization may occur in the nickel layer 222 and such oxidization may hinder appropriate formation of the gold layer 224, thereby leading to problems when soldering.

FIG. 4 shows a cross-section of a solder ball land on the upper conductive pad 210. The solder ball land may refer to a surface of the solder ball processed by using an organic solderability preservative (OSP) film 230. The OSP film 230 is a layer of an organic compound in the form of alkyl imidazole that is formed on the upper conductive pad 210 to about 0.2 μm to about 0.4 μm and is capable of mitigating or preventing oxidization of Cu in the upper conductive pad 210. Because the OSP film 230 can be selectively plated on the upper conductive pad 210, the OSP film 230 may be a desirable technique for highly dense micro circuits. Further, the OSP film 230 is an environment-friendly material that causes no pollution.

However, because the solder ball land (e.g., the connecting area of the upper conductive pad 210 exposed by the solder resist 118) is coated with the OSP film 230, which is an organic material, the OSP film 230 may break when the solder ball land is damaged. In such case, the upper conductive pad 210 may be directly exposed to air. Further, storing such surface processed PCB for a long time may negatively affect mounting reliability when a chip is mounted on the PCB. Because the upper conductive pad 210 and the solder ball may directly contact each other during the soldering process, too much Cu may dissolve into the solder ball from the upper conductive pad 120, and thus decrease thermal cycling reliability.

Figure 5:
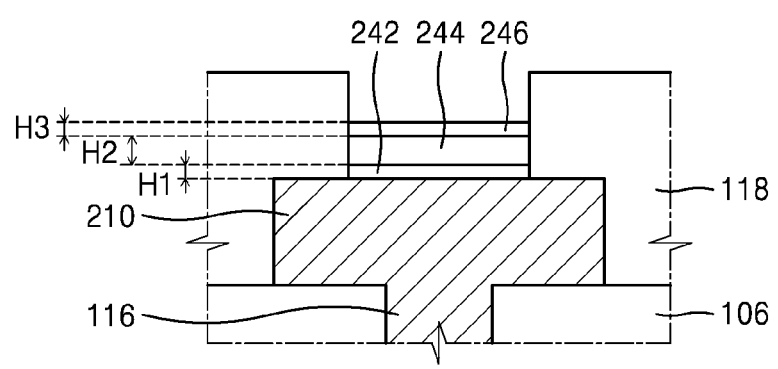
FIG. 5 is an enlarged cross-sectional view of a solder ball land of a PCB, according to an example embodiment of the inventive concepts.

FIG. 5 is an enlarged cross-sectional view of a solder ball land of a PCB (III of FIG. 2), according to an example embodiment of the inventive concepts.

FIG. 5 shows the upper conductive pad 210 surface processed according to an example embodiment. The upper conductive pad 210 may include Cu. As described above, Cu is prone to oxidation when exposed to air. Such oxidization may hinder soldering, thereby causing the solder balls to become inappropriately mounted on the upper conductive pad 210 of the PCB 110.

As described below, the surface processing method of the upper conductive pad 210 of the PCB 110 according to this example embodiment may be different from the comparative examples illustrated in FIGS. 3 and 4. Herein below, details of the surface processing method will be described.

First, a first metal layer 242 is formed on the upper conductive pad 210. The first metal layer 242 may include nickel (Ni). The first metal layer 242 may be formed by, for example, using electroless plating, physical vapor deposition (PVD), or chemical vapor deposition (CVD). When the first metal layer 242 is formed by using the electroless plating technique, the first metal layer 242 can be selectively formed on the upper conductive pad 210. Therefore, the electroless plating may be appropriate for highly dense micro circuits.

The upper conductive pad 210 may include Cu. The first metal layer 242 including Ni may be formed first on the upper conductive pad 210 no as to mitigate or prevent a material in a second metal layer 244 on the first metal layer 242 from entering into a Cu structure in the upper conductive pad 210. However, a material for forming the first metal layer 242 is not limited to Ni, and any metal that may block or hinder spreading of the second metal layer 244 into the Cu structure in the upper conductive pad 210 may be used.

A height H1 of the first metal layer 242 may range from about 1 μm to about 20 μm. When the height H1 is less than about 1 μm, the first metal layer 242 may not properly function as a spreading prevention layer, and when the height H1 exceeds about 20 μm, solderability of the solder ball land may decrease.

Afterwards, the second metal layer 244 may be formed on the first metal layer 242. The second metal layer 244 may include Cu. The second metal layer 244 is formed on the first metal layer 242 so as to maintain solderability as Ni in the first metal layer 242 has low affinity with solder balls. Further, if an OSP film 246 is formed on the first metal layer 242 without the intervening second metal layer 244, the first metal layer 242 and the OSP 246 may chemically react with each other, and thus chemical properties of the OSP film 246 can be modified.

A height H2 of the second metal layer 244 may range from about 0.05 μm to about 2 μm. For example, the height H2 of the second metal layer 244 may range from about 0.15 μm to about 0.95 μm. The second metal layer 244 may be formed to a height that allows for the second metal layer 244 to be sufficiently dissolved into solder balls (320 of FIG. 7) during soldering. When the height H2 of the second metal layer 244 is too small, solderability may decrease. When the height H2 of the second metal layer 244 is too large, an amount of Cu in the solder balls may increase during soldering and thus cause a decrease in thermal cycling reliability.

Thereafter, the OSP film 246 may be formed on the second metal layer 244. Because a surface of the second metal layer 244 including Cu can be oxidized when exposed to air, the OSP film 246 is plated on the second metal layer 244 to mitigate or prevent oxidation. In the PCB manufacturing method according to an example embodiment, the OSP film 246 may include, for example, an epoxy resin film, a polyimide film, or a polyetherimide film.

A height H3 of the OSP 246 may range from about 0.05 μm to about 2 μm. When the height H3 is less than about 0.05 μm, the second metal layer 244 may not appropriately prevent oxidation, and when the height H3 exceeds about 2 μm, solderability may decrease.

The surface of the upper conductive pad 244 of the PCB 110 may be processed by performing the operations described above. The surface processed PCB may be used as a semiconductor substrate during a semiconductor package manufacturing process.

Figure 6:
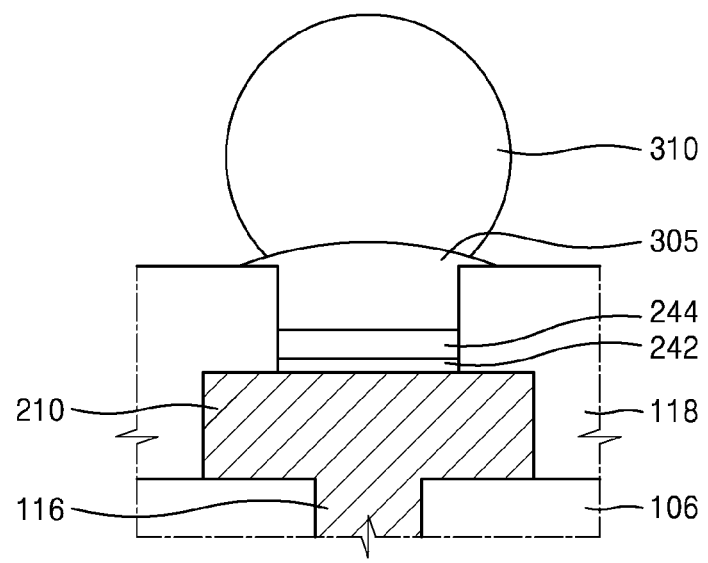
FIGS. 6, 7, and 8 are cross-sectional views for describing a method of manufacturing a semiconductor package, according to some example embodiments of the inventive concepts.
Figure 7:
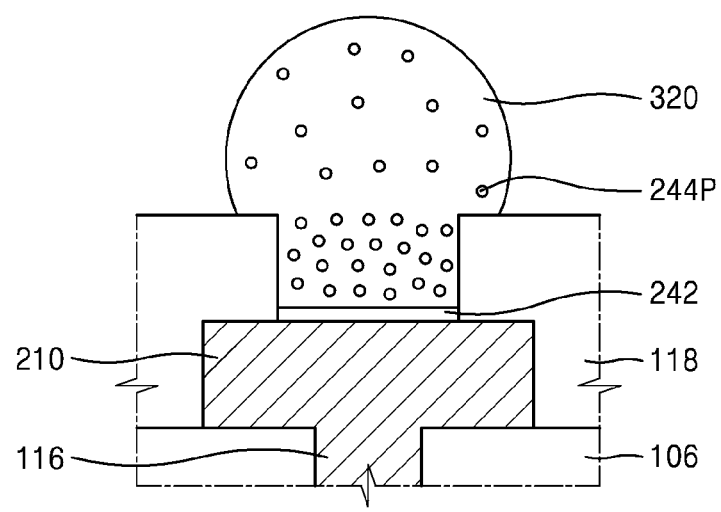
Figure 8:
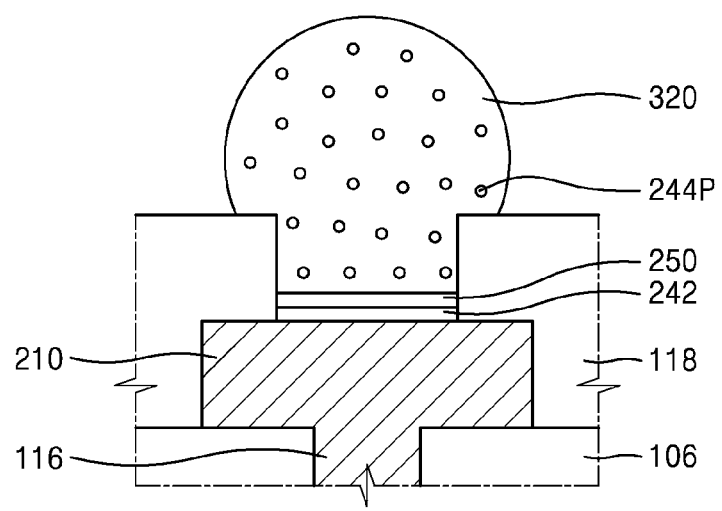

FIGS. 6, 7, and 8 are cross-sectional views for describing a method of manufacturing a semiconductor package, according to some example embodiments of the inventive concepts.

A method of processing a surface of an upper conductive pad (e.g., solder ball land) of a PCB according to an example embodiment has been described. In a flip chip packaging process during a semiconductor package manufacturing process, a semiconductor chip is electrically connected to solder balls formed in a solder ball land of the PCB in a flip chip manner.

Referring to FIG. 6, before bonding the solder balls, the OSP film 246 at the top is cleansed by coating the surface processed solder ball land with flux 305.

The flux 305 may be a viscous agent, and the surface processed solder ball land may be coated with the flux 305 to remove the OSP film 246. An alcoholic component and an acidic component in the flux 305 may dissolve the OSP film 246, which is an organic material.

Removing the OSP film 246 using the flux 305 may be desirable. In the event that soldering process is performed while the OSP film 246 is plated on the surface processed solder ball land, the OSP film 246 may remain on the resultant solder ball land in a thermally damaged state due to heat generated during the soldering process, which is performed at a high temperature.

When the OSP film 246 in the thermally damaged state remains on the resultant solder ball land, the OSP film 246 may hinder interaction between Cu in the upper conductive pad 210 and Sn in the solder balls (320 of FIG. 7) and thus prevent a formation of an intermetallic compound (250 of FIG. 8). Further, the remaining OSP film 246 may prevent the solder balls (320 of FIG. 7) from being appropriately bonded to the upper conductive pad 210. Therefore, in order to prevent such phenomena, removing the OPS film 246 using the flux 305 before the soldering process is desired.

Referring to FIG. 7, after the OSP film 246 of FIG. 6 is removed, preliminary solder balls 310 of FIG. 6 may be soldered by performing, for example, reflow soldering or wave soldering on the solder ball land. During the soldering process, the second metal layer 244 of FIG. 6 may completely dissolve into the preliminary solder balls 310 and sustain metal atoms 244P from the second metal layer 244 in the solder balls 310, thereby forming resultant solder balls 320. While performing reflow soldering or wave soldering, Cu in the metal atoms 244P may dissolve into the solder balls 310 and occupy about 0.01 wt % to about 0.5 wt % of the solder balls 310. Thermal cycling reliability may decrease when too much Cu is included in solder balls during soldering. Therefore, the height H2 of the second metal layer 244 may be appropriately adjusted with regard to the weight of the solder balls 310. The second metal layer 244 may dissolve into the solder balls 310 and change components of the solder balls 310. A weight ratio of Cu in the metal atoms 244P to the solder balls 310 may be appropriately adjusted such that properties of the solder balls 310 are not negatively affected.

Referring to FIGS. 6 and 8, the preliminary solder balls 310 may be unleaded solder balls including Sn. In such a case, an intermetallic compound 250 including Ni, Sri, and Cu may be formed on the first metal layer 242 when the soldering process is completed. The intermetallic compound 250 may have a composition ratio of for example, $(Ni,Cu)_3Sn_4$. Cu in the intermetallic compound 250 may be a portion of the metal atoms 244P from the preliminary solder balls 310.

Due to the intermetallic compound 250, the resultant solder balls 320 and the upper conductive pad 210 may be bonded to each other with improved thermal cycling reliability. Referring to FIGS. 1 and 8, the semiconductor chip 120 may be mounted on the PCB 110 such that the semiconductor chip 120 is electrically connected to the PCB 110, using the solder balls 320 as the internal connecting terminals 320. Thereafter, the underfill 130 and the molding material 140 may be formed to manufacture the semiconductor package 1000A.

Figure 9:
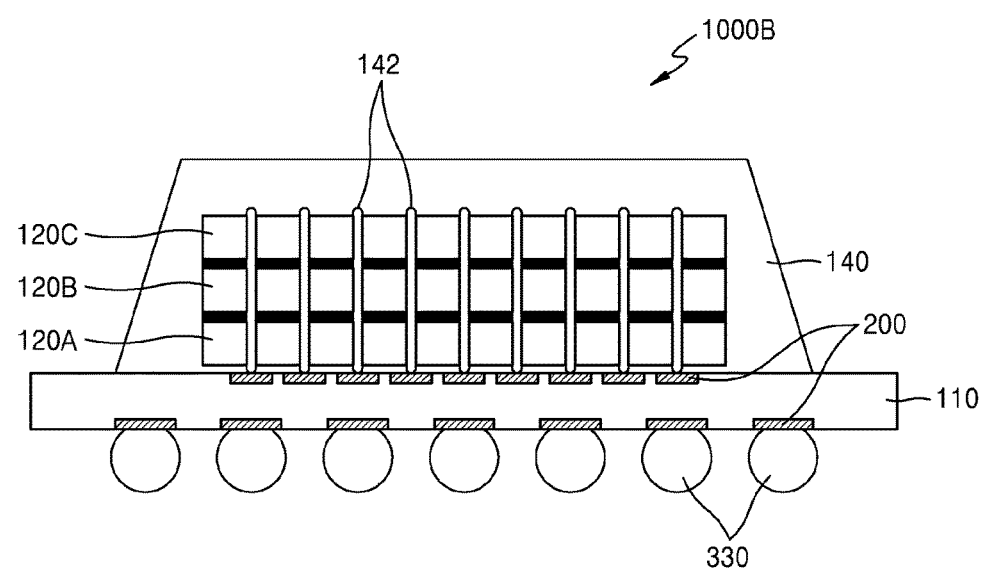
FIG. 9 is a cross-sectional view of a semiconductor package manufactured by a method of manufacturing the semiconductor package, according to an example embodiment of the inventive concepts.

FIG. 9 is a cross-sectional view of a semiconductor package 1000B manufactured by a method of manufacturing the semiconductor package 1000B, according to an example embodiment of the inventive concepts.

As described with reference to FIG. 1, the semiconductor package 1000A manufactured according to an example embodiment is configured such that one semiconductor chip 120 is mounted on the PCB 110 via the internal connecting terminals 320.

Referring to FIG. 9, the same method may be applied to a multi-chip semiconductor package 1000B in which a plurality of semiconductor chips 120A, 120B, and 120C are vertically stacked and mounted on a PCB 110 via through silicon vias 142. Internal connecting terminals (not shown) may be formed under the through silicon vias 142. According to some example embodiments, the semiconductor chips 120A, 120B, and 120C may be mounted a horizontal direction instead of a vertical direction. The semiconductor package 1000B may include a molding material 140 on the PCB 110 which seals the semiconductor chips 120A, 120B, and 120C, and external connecting terminals 330 under the PCB 110 which may extend the function of the semiconductor chips 120A, 120B, and 120C to an external device.

The PCB 110 manufactured according to the PCB manufacturing method above may include a solder ball land 200 on a surface processed conductive pattern. The internal connecting terminals (not shown) and/or the external connecting terminals 330 may be provided on the surface processed solder ball land 200.

Figure 10:
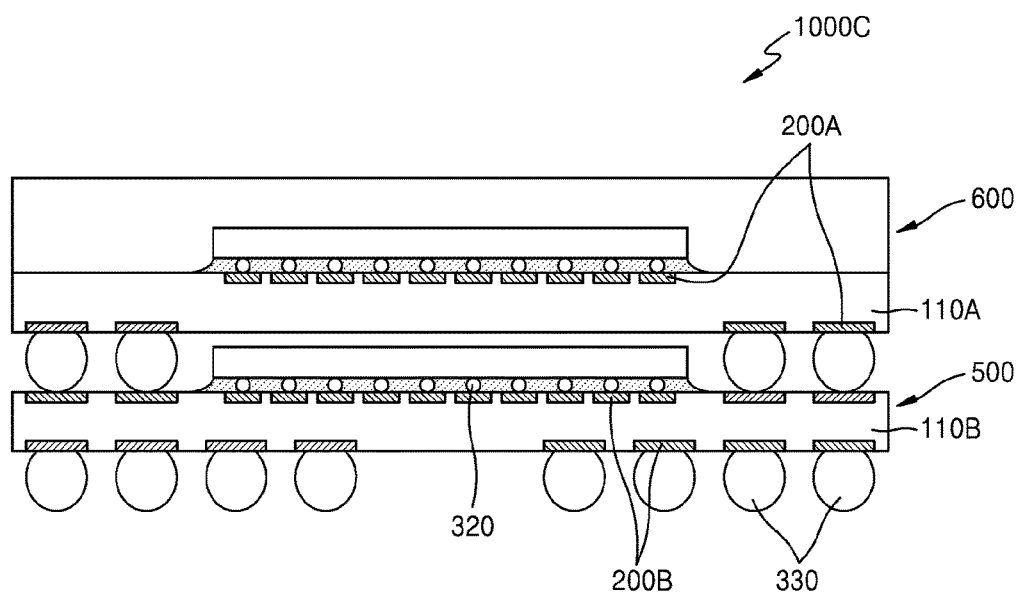
FIG. 10 is a cross-sectional view of a semiconductor package manufactured by a method of manufacturing the semiconductor package, according to an example embodiment of the inventive concepts.

FIG. 10 is a cross-sectional view of a semiconductor package 1000C manufactured by a method of manufacturing the semiconductor package 1000C, according to an example embodiment of the inventive concepts.

Referring to FIG. 10, the method of manufacturing the semiconductor package 1000C according to an example embodiment may be applied to a system in package (SiP) in the form of a package on package (PoP). For example, the semiconductor package 1000C may include a PCB 110A of an upper semiconductor package 600 and a PCB 110B of a lower semiconductor package 500.

The PCBs 110A and 110B may be manufactured based on the above-described PCB manufacturing method, and each of the PCBs 110A and 110B may include, on a conductive pattern, a solder ball land 200A and a solder ball land 200B that are surface processed. The internal connecting terminals 320 and/or the external connecting terminals 330 may be formed on the surface processed solder ball lands 200A and 200B.

Figure 11:
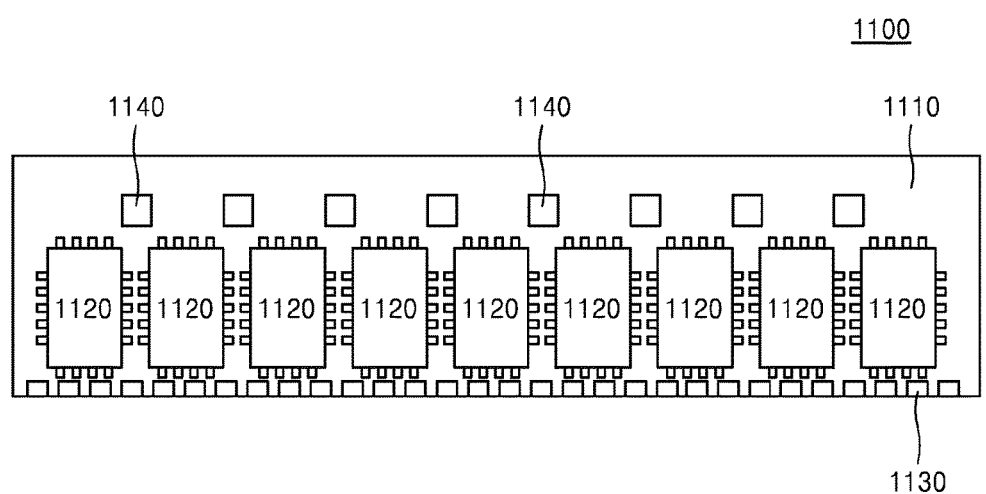
FIG. 11 is a plan view of a semiconductor module including semiconductor packages manufactured by a method of manufacturing the semiconductor packages, according to an example embodiment of the inventive concepts.

FIG. 11 is a plan view of a semiconductor module including semiconductor packages manufactured by a method of manufacturing the semiconductor packages, according to an example embodiment of the inventive concepts.

Referring to FIG. 11, a memory module 1100 may include a module substrate 1110, and a plurality of semiconductor packages 1120 bonded to the module substrate 1110.

The semiconductor packages 1120 may include at least one semiconductor package according to the above example embodiments. For example, the semiconductor packages 1120 may include the semiconductor package 1000A of FIG. 1, the semiconductor package 1000B of FIG. 9, and/or the semiconductor package 1000C of FIG. 10.

Connectors 1130 may be provided on one side of the module substrate 1110. The connectors 1130 may be inserted into a socket of a main board. Ceramic decoupling capacitors 1140 may be provided on the module substrate 1110. However, the memory module 1100 is not limited to the example shown in FIG. 11, and may be modified in various ways.

Figure 12:
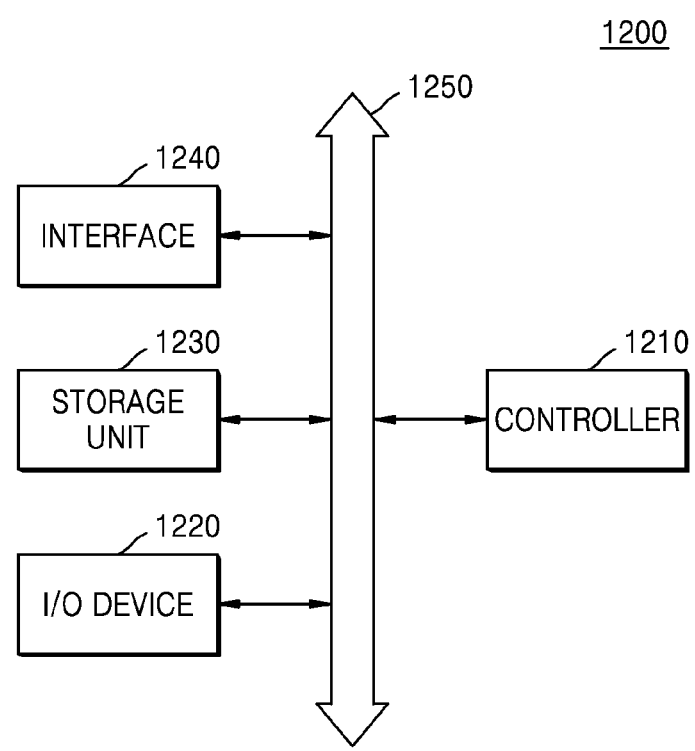
FIG. 12 is a block diagram of a system including a semiconductor package manufactured by a method of manufacturing the semiconductor package, according to an example embodiment of the inventive concepts.

FIG. 12 is a block diagram of a system 1200 including a semiconductor package manufactured by a method of manufacturing the semiconductor package, according to an example embodiment of the inventive concepts.

Referring to FIG. 12, the system 1200 includes a controller 1210, an in/output (I/O) device 1220, a storage unit 1230, and an interface 1240.

The system 1200 may be a mobile system or an information transmission and reception system. According to some example embodiments, the mobile system may include a personal digital assistant (PDA), a portable computer, a web tablet, a wireless phone, a mobile phone, a digital music player, or a memory card.

The controller 1210 may control programs executed in the system 1200, and may include a microprocessor, a digital signal processor, a microcontroller, or the like.

The I/O device 1220 may input or output data of the system 1200. The system 1200 may be connected with an external device, e.g., a personal computer or a network, via the I/O device 1220, and exchange data with the external device. The I/O device 1220 may include, for example, a keypad, a keyboard, or a display device.

The storage unit 1230 may store code and/or data for operations of the controller 1210, or store data processed by the controller 1210. The storage unit 1230 may include at least one semiconductor package according to the above example embodiments. For example, the storage unit 1230 may include the semiconductor package 1000A of FIG. 1, the semiconductor package 1000B of FIG. 9, and/or the semiconductor package 1000C of FIG. 10.

The interface 1240 may function as a data transmission path between the system 1200 and external devices. The controller 1210, the I/O device 1220, the storage unit 1230, and the interface 1240 may communicate with each other via a bus 1250.

The system 1200 may be used in mobile phones, MP3 players, navigation devices, portable multimedia players (PMPs), solid state disk (SSD), and/or household appliances.

Figure 13:
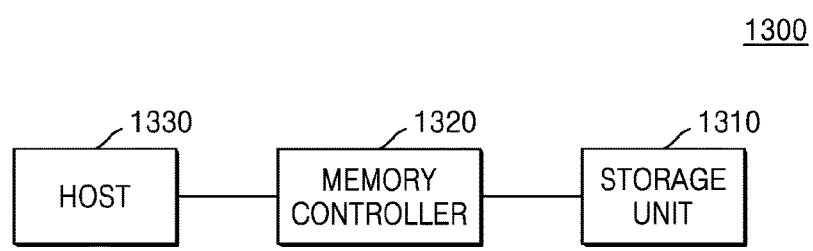
FIG. 13 is a block diagram of a memory card including a semiconductor package manufactured by a method of manufacturing the semiconductor package, according to an example embodiment of the inventive concepts.

FIG. 13 is a block diagram of a memory card 1300 including a semiconductor package manufactured by a method of manufacturing the semiconductor package, according to an example embodiment of the inventive concepts.

Referring to FIG. 13, the memory card 1300 includes a storage unit 1310 and a memory controller 1320.

The storage unit 1310 may store data. According to some example embodiments, the storage unit 1310 may be non-volatile and maintain stored data even when power is not supplied. The storage unit 1310 may include at least one semiconductor package according to the above example embodiments. For example, the storage unit 1310 may include the semiconductor package 1000A of FIG. 1, the semiconductor package 1000B of HG. 9, and/or the semiconductor package 1000C of FIG. 10.

In response to read/write requests from a host 1330, the memory controller 1320 may read the data stored in the storage unit 1310 or store data in the storage unit 1310.

While the inventive concepts has been particularly shown and described with reference to example embodiments thereof, it will be understood that various changes in form and details may be made therein without departing from the spirit and scope of the following claims.

What is claimed is:

1. A method of manufacturing a printed circuit board (PCB), the method comprising:
   preparing a substrate including an insulating layer and a protected layer;
   exposing the protected layer through the insulating layer;
   forming a first metal layer on the protected layer;
   forming a second metal layer on the first metal layer, the second metal layer including copper;
   forming an organic solderability preservative (OSP) film on the second metal layer;
   removing the OSP using a flux; and
   placing, after the removing, a solder ball on the second metal layer.

2. The method of claim 1, wherein the protected layer is a conductive pattern including copper.

3. The method of claim 1, wherein the first metal layer includes nickel.

4. The method of claim 1, wherein a height of the first metal layer ranges from about 1 μm to about 20 μm.

5. The method of claim 1, wherein a height of the second metal layer ranges from about 0.05 μm to about 2 μm.

6. The method of claim 5, wherein the height of the second metal layer ranges from about 0.15 μm to about 0.95 μm.

7. The method of claim 1, wherein a height of the OSP film ranges from about 0.05 μm to about 2 μm.

8. A method of manufacturing a semiconductor package, the method comprising:
   preparing a printed circuit board (PCB) including a protected layer;
   exposing a portion of the protected layer;
   forming a solder ball land by processing the exposed surface of the protected layer;
   forming a solder ball on the solder ball land; and
   mounting a semiconductor chip on the solder ball formed on the PCB,
   wherein the solder ball includes copper of about 0.01 wt % to about 0.5 wt %,
   wherein the forming a solder ball land includes,
      forming a nickel layer on the protected layer,
      forming a copper layer on the nickel layer, and forming an organic solderability preservative (OSP) film on the copper layer, and
wherein the forming a solder ball includes,
   removing the OSP film,
   providing the solder ball on the copper layer, and
   dissolving the copper layer into the solder ball such that the solder ball and the nickel layer are bonded to each other.

9. The method of claim 8, wherein the solder ball is an unleaded solder ball including tin.

10. The method of claim 9, wherein after the dissolving, an intermetallic compound including an alloy of nickel, copper, and tin are formed between the nickel layer and the solder ball.

11. The method of claim 8, wherein the removing the OSP includes removing the OSP film by coating the OSP film with flux including an alcoholic component and an acidic component.

12. The method of claim 8, wherein a height of the copper layer before the dissolving ranges from about 0.15 µm to about 0.95 µm; and
   after completing the dissolving, the solder ball includes copper of about 0.01 wt % to about 0.5 wt %.

13. The method of claim 8, wherein a height of the nickel layer ranges from about 1 µm to about 20 µm, and a height of the OSP film ranges from about 0.05 µm to about 2 µm.

14. A method of manufacturing a printed circuit board (PCB), the method comprising:
   forming a stack of a first metal layer, a second metal layer, and a oxidation prevention layer on a solder ball land in the PCB,
   removing the oxidation prevention layer using a flux, and
   placing, after the removing, a solder ball on the second metal layer.

15. The method of claim 14, wherein the first metal layer includes a first material that at least inhibits a second material in the second metal layer from dissolving into the solder ball land.

16. The method of claim 15, wherein the first material is nickel.

17. The method of claim 14, further comprising:
   performing soldering such that the second metal layer is dissolved into the solder ball.

18. The method of claim 14, further comprising:
   performing soldering such that the second metal layer is dissolved into the solder balls, while leaving an intermetallic compound on the first metal layer.

* * * * *